(12) United States Patent
Cote

(10) Patent No.: US 9,730,347 B2
(45) Date of Patent: Aug. 8, 2017

(54) SCENTED UNIVERSAL SERIAL BUS DRIVES AND METHODS TO MAKE THE SAME

(71) Applicant: Christopher W. E. Cote, Santee, CA (US)

(72) Inventor: Christopher W. E. Cote, Santee, CA (US)

(*) Notice: Subject to any disclaimer, the term of this patent is extended or adjusted under 35 U.S.C. 154(b) by 10 days.

(21) Appl. No.: 15/048,663

(22) Filed: Feb. 19, 2016

(65) Prior Publication Data
US 2016/0249473 A1 Aug. 25, 2016

Related U.S. Application Data

(60) Provisional application No. 62/119,053, filed on Feb. 20, 2015.

(51) Int. Cl.
H05K 5/02 (2006.01)
B29C 45/00 (2006.01)
B29C 70/68 (2006.01)
B29K 27/06 (2006.01)
B29L 31/34 (2006.01)
B29K 105/00 (2006.01)

(52) U.S. Cl.
CPC ....... *H05K 5/0278* (2013.01); *B29C 45/0001* (2013.01); *B29C 70/682* (2013.01); *B29K 2027/06* (2013.01); *B29K 2105/0029* (2013.01); *B29L 2031/3425* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,609,935 B2* | 8/2003 | Huang | ................... | H01R 13/66 392/390 |
| 7,152,758 B2* | 12/2006 | Fazzio | ................... | A45D 34/02 222/145.1 |
| 7,389,878 B1* | 6/2008 | Torrico | ................ | G06K 19/077 206/39.4 |
| 7,512,415 B2* | 3/2009 | Fazzio | ................... | A61L 9/035 222/145.1 |
| 7,699,713 B2* | 4/2010 | Chrisman, III | .... | A63B 37/0001 473/125 |
| 7,778,531 B2* | 8/2010 | Cheung | ..................... | A61L 9/03 392/386 |
| 8,032,014 B2* | 10/2011 | Cheung | ..................... | A61L 9/03 392/386 |
| 8,068,725 B2* | 11/2011 | Cheung | ................... | A61L 9/037 392/386 |
| 8,625,977 B2* | 1/2014 | Cheung | ................... | A61L 9/037 392/386 |
| 8,784,747 B2* | 7/2014 | Carmichael | ............... | A61L 9/04 239/34 |
| 8,927,617 B2* | 1/2015 | Funk | ................... | A61F 13/8405 512/4 |

(Continued)

Primary Examiner — Lisa Lea Edmonds

(57) ABSTRACT

A method of manufacturing a scented USB drive includes providing a fragrance; providing a molding composition; mixing the fragrance with the molding composition, the mixing forming a molding compound; injecting the molding compound into a mold and around a recess configured to receive a circuit board; and cooling the molding compound until the solid USB drive is formed, the solid scented USB drive emitting a selective scent.

19 Claims, 10 Drawing Sheets

(56) References Cited

U.S. PATENT DOCUMENTS

| | | | | |
|---|---|---|---|---|
| 9,408,936 B2* | 8/2016 | Esses | ............... | A61L 9/03 |
| 2003/0206834 A1* | 11/2003 | Chiao | ............... | A61L 9/014 |
| | | | | 422/124 |
| 2004/0203412 A1* | 10/2004 | Greco | ............... | H04M 1/21 |
| | | | | 455/66.1 |
| 2004/0204043 A1* | 10/2004 | Wang | ............... | G06F 1/1616 |
| | | | | 455/556.1 |
| 2004/0235430 A1* | 11/2004 | Ma | ............... | A61L 9/03 |
| | | | | 455/90.1 |
| 2006/0258215 A1* | 11/2006 | Lai | ............... | A61L 9/03 |
| | | | | 439/607.01 |
| 2006/0293871 A1* | 12/2006 | Fazzio | ............... | A61L 9/035 |
| | | | | 703/5 |
| 2009/0196587 A1* | 8/2009 | Cheung | ............... | A61L 9/037 |
| | | | | 392/394 |
| 2009/0261181 A1* | 10/2009 | Cheung | ............... | H01R 13/66 |
| | | | | 239/129 |
| 2011/0132995 A1* | 6/2011 | Perman | ............... | A61L 9/03 |
| | | | | 239/34 |
| 2012/0298770 A1* | 11/2012 | Cheung | ............... | A61L 9/037 |
| | | | | 239/128 |
| 2013/0136432 A1* | 5/2013 | Cheung | ............... | A61L 9/037 |
| | | | | 392/390 |
| 2015/0004066 A1* | 1/2015 | Leon | ............... | A45D 34/02 |
| | | | | 422/125 |
| 2016/0022855 A1* | 1/2016 | Esses | ............... | B60H 3/0007 |
| | | | | 392/386 |
| 2016/0022857 A1* | 1/2016 | Esses | ............... | A61L 9/032 |
| | | | | 392/390 |

* cited by examiner

SCENTED UNIVERSAL SERIAL BUS DRIVES AND METHODS TO MAKE THE SAME

BACKGROUND

Technical Field

The present disclosure is directed to portable data storage devices, such as universal serial bus drives, and more particularly, to scented portable storage devices.

Description of the Related Art

Universal serial bus ("USB") drives are conventionally constructed of a rectangular plastic casing surrounding a computer circuit board coupled to a connector. USB drives may also include a rectangular plastic cap that is removable at one end to expose the connector of the USB drive, for the purpose of inserting into a computer. Few modifications or features to make the USB drives more appealing and marketable have been introduced over the years, and consequently the lack of distinguishing features amongst the different USB drives currently available make consumers' choice difficult.

BRIEF SUMMARY

The methods and devices described herein provide for USB drives that are particularly appealing and marketable, with robust and efficient form factors. According to one embodiment, a method of manufacturing a scented USB drive may be summarized as including providing a fragrance; providing a molding composition; and mixing the fragrance with the molding composition. The fragrance may be liquid based or powder based. The molding composition may include liquid silicone or liquid PVC. The mixing may form a molding compound. The method may further include injecting the molding compound into a mold and around a recess configured to receive a circuit board; and cooling the molding compound until a solid USB drive is formed. The solid scented USB drive may emit a selective scent.

According to another embodiment, a USB drive may be summarized as including a housing enclosing a circuit board of the USB drive and a cover configured to be removably coupled to the housing. The cover and the housing may comprise a molding compound including a fragrance and a molding composition. The molding compound can be configured to emit a selective scent.

DETAILED DESCRIPTION

In the following description, certain specific details are set forth in order to provide a thorough understanding of various disclosed embodiments. One skilled in the relevant art will recognize that embodiments may be practiced without one or more of these specific details. In other instances, well-known structures and devices associated with USB drives and methods to manufacture the same may not be shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
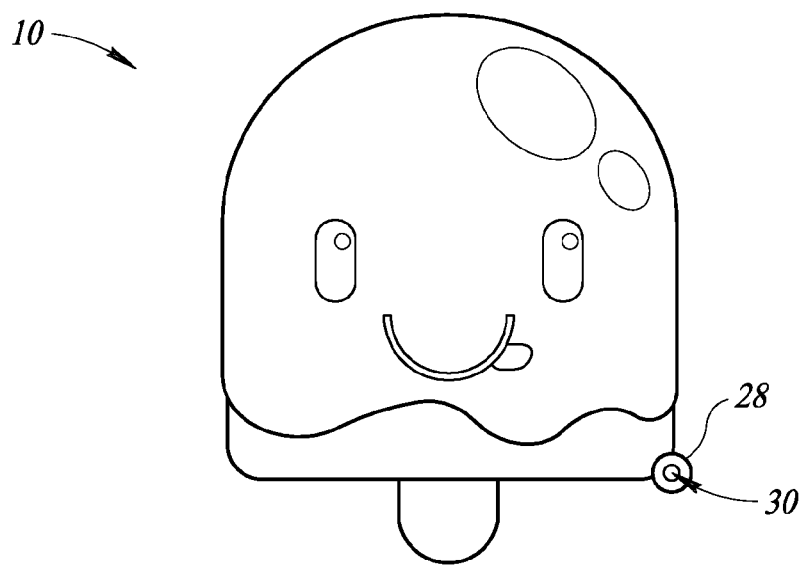
FIG. 1 is a plan view of a scented USB drive in a closed configuration, according to one embodiment.
Figure 2:
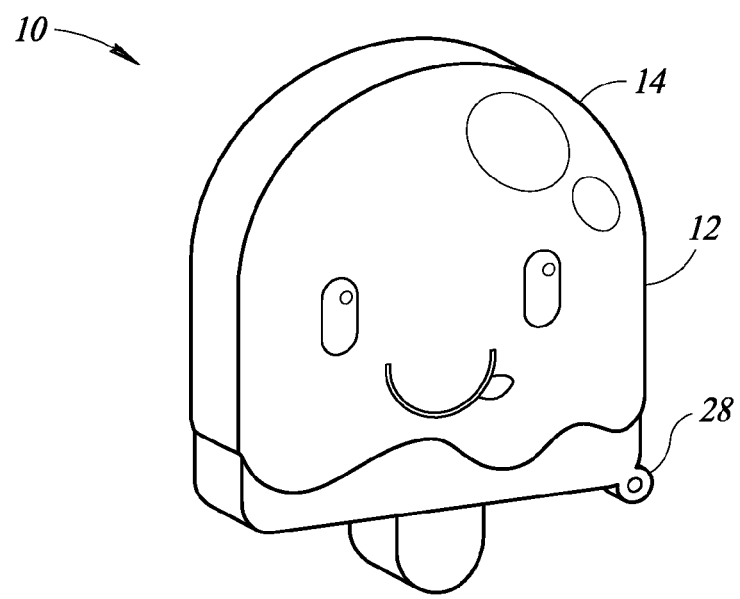
FIG. 2 is a perspective view of the scented USB drive of FIG. 1 in the closed configuration.
Figure 3:
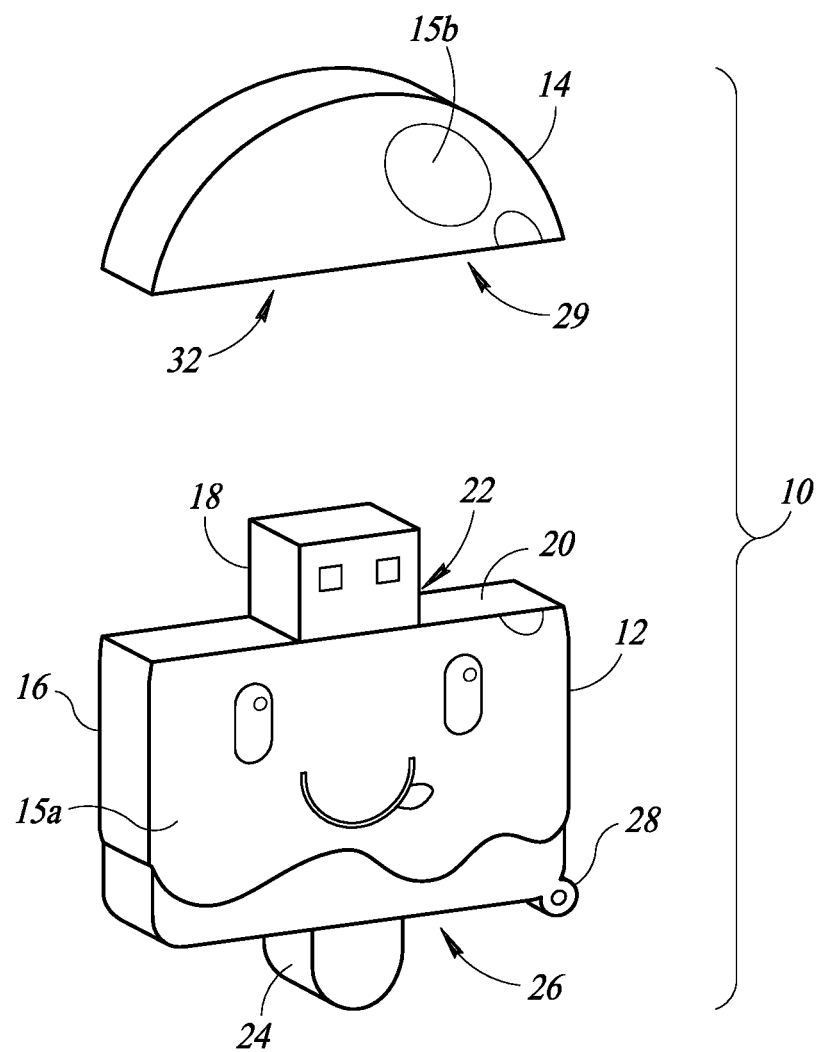
FIG. 3 is a perspective view of the scented USB drive of FIG. 1 in an open configuration.

FIGS. 1 through 3 illustrate a scented USB drive 10 according to one embodiment. FIGS. 1 and 2 illustrate the scented USB drive 10 in a closed configuration. FIG. 3 illustrates the scented USB drive 10 in an open configuration. The USB drive 10 includes a housing 12 and a cover 14. As illustrated in FIG. 3, the cover 14 is configured to be removably coupled to the housing 12 when in the open configuration. When the cover 14 is coupled to the housing 12, the illustrated USB drive 10 advantageously creates a general shape of an ice cream bar, or other frozen confection. In particular, the housing 12 includes a representation to depict an ice cream bar. For example, the USB drive 10 illustrated in FIGS. 1 through 3 includes labels 15a, 15b which display eyes, mouth, various color schemes, etc., to depict the ice cream bar. These labels 15a, 15b can be coupled to the housing 12 and/or the cover 14, respectively. For example, the labels 15a, 15b can be adhesively coupled to the housing 12 and/or the cover 14.

The housing 12 forms a lower portion of the USB drive 10 when in the closed configuration. The housing 12 includes a main body 16. The main body 16 encloses therein a circuit board of the USB drive 10. The circuit board is coupled to a connector 18 in a known manner. The connector 18 may be a USB 3.0 A-type, B-Type, Micro or Mini, or other type of connector. The main body 16 provides a protective shield to the circuit board and also to the connector 18 when the housing 12 is coupled to the cover 14, in the closed configuration. The connector 18 extends outwardly a certain distance from an upper surface 20 of the main body 16. In particular, the upper surface 20 includes an aperture 22 to allow the connector 18 to protrude outwardly from the main body 16. The distance of protrusion of the connector 18 may be adjustable, such that the USB drive 10 can be coupleably received by a device, such as a personal computer, printer, mobile phone, or the like. For example, such devices may have a USB port with a certain depth to coupleably receive the USB drive 10. The protrusion of the connector 18 may therefore be sized and shaped to be coupleably received by such devices.

The illustrated housing 12 includes a stick portion 24 located at a lower surface 26 of the housing 12. The stick portion 24 is generally semi-cylindrically shaped and, further, sized and shaped to create an appearance of a stick of the ice cream bar.

The housing 12 also includes a projection 28. The projection 28 can be located proximal to an intersection of a lower side of the main body 16 and a side extending perpendicularly from the lower side of the main body 16. The projection 28 is cylindrically shaped and includes a utility aperture 30 extending therethrough. The utility aperture 30 of the projection 28 can be configured such that the USB drive 10 can be coupled to holding devices. For example, the utility aperture 30 can be removably coupled to a key chain ring, identification badge lanyard, or the like.

With continued reference to FIGS. 1 through 3, the cover 14 forms an upper portion of the USB drive 10 when in the closed configuration. The illustrated cover 14 is generally semi-cylindrically shaped. The cover 14 includes a lower surface 29 which extends laterally and longitudinally. The lower surface 29 is configured such that, when the cover 14 is coupleably received by the housing 12, the cover 14 substantially abuts or makes contact with the upper surface 20 of the housing 12. More particularly, the area of the lower surface 29 (i.e., length, width) can be substantially similar to the area (i.e., length, width) of the upper surface 20 of the housing 12. In this manner, when the cover 14 is coupled to the housing 12, the USB drive 10 appears as a unitary structure.

The cover 14 includes a cavity 32 extending through the lower surface 29. The cavity 32 can be configured to have a peripheral area (i.e., length, width) which is the same or slightly less than the peripheral area (i.e., length, width) of the connector 18, such that the cover 14 can be removably coupleably received by the housing 12. Further, the cavity 32 extends through the cover 14 a certain depth, which may be at least the same depth or more than the protrusion of the connector 18 from the upper surface 20 of the housing 12. Again, in this manner, when the cover 14 is coupleably received by the housing 12, the USB drive 10 appears as a unitary structure.

Figure 4:
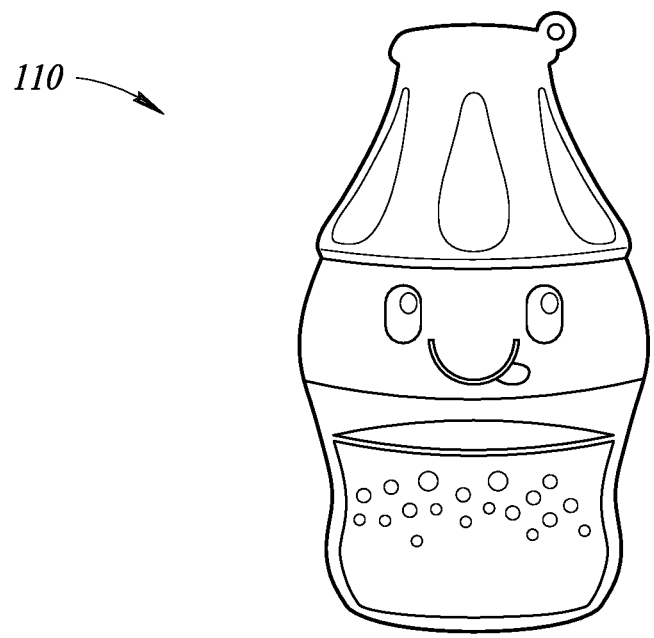
FIG. 4 is a plan view of a scented USB drive in a closed configuration, according to another embodiment.
Figure 5:
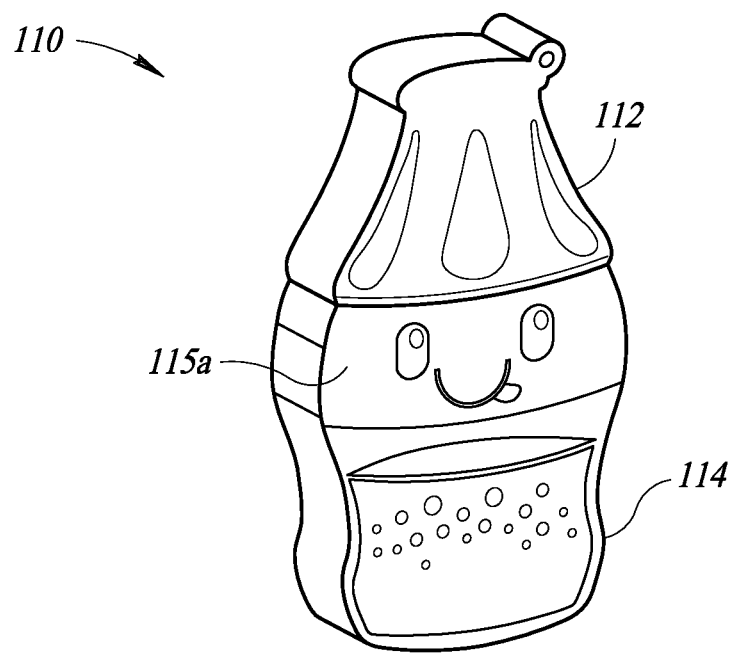
FIG. 5 is a perspective view of the scented USB drive of FIG. 4 in the closed configuration.
Figure 6:
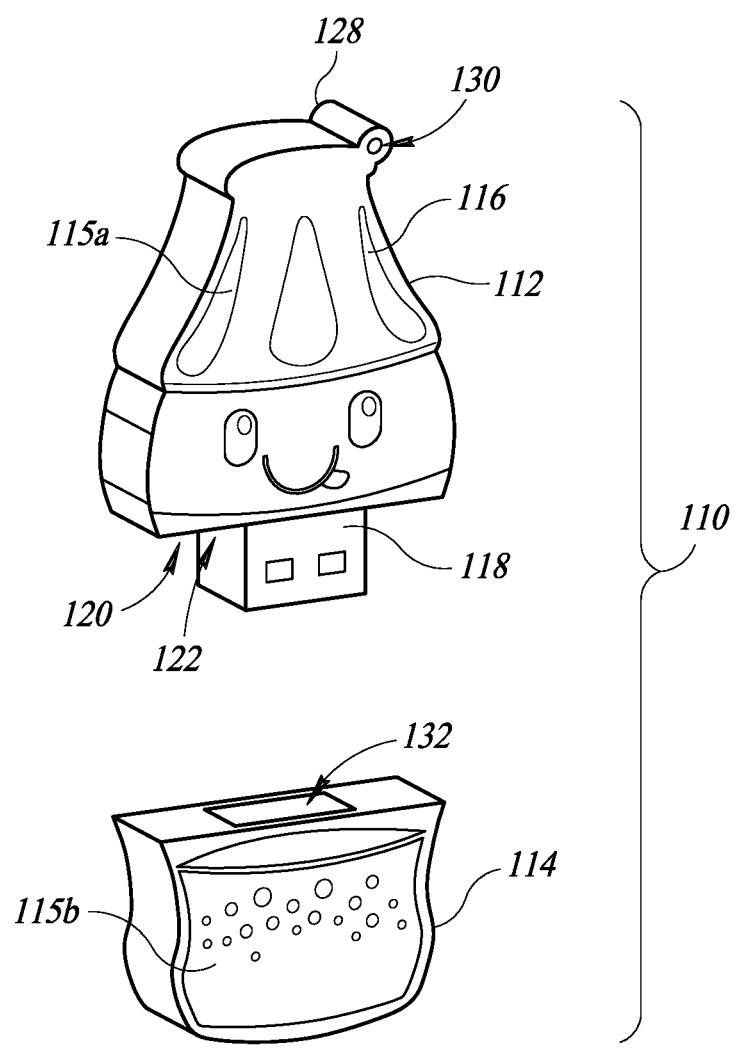
FIG. 6 is a perspective view of the scented USB drive of FIG. 4 in an open configuration.

FIGS. 4 through 6 illustrate a USB drive 110 according to another embodiment. The USB drive 110 provides a variation in which the USB drive 110 includes a housing 112 and a cover 114, where the housing 112 forms an upper portion and the cover 114 forms a lower portion of the USB drive 110, when in a closed configuration. More particularly, the housing 112 and the cover 114 are configured to be removably coupleable to each other to advantageously create a general shape of a bottle, such as a soda bottle, for example.

Again, the housing 112 and the cover 114 can include a representation to depict the bottle. For example, the USB drive 110 illustrated in FIGS. 4 through 6 includes labels 115a, 115b which display eyes, mouth, level of liquid, various color schemes, etc., to depict the bottle. These labels 115a, 115b can be coupled to the housing 112 and/or the cover 114, respectively. For example, the labels 115a, 115b can be adhesively coupled to the housing 112 and/or the cover 114.

Again, the housing 112 includes a main body 116. The main body 116 encloses therein a circuit board of the USB drive 110. The circuit board is coupled to a connector 118 in a known manner. The connector 118 may be a USB 3.0 A-type, B-Type, Micro or Mini, or other type of connector. The main body 116 provides a protective shield to the circuit board and also to the connector 118 when the cover 114 is coupled to the housing 112 in the closed configuration. As noted above, the connector 118 extends outwardly a certain distance from a lower surface 120 of the main body 116. In particular, the lower surface 120 can include an aperture 122 to allow the connector 118 to protrude outwardly from the main body 116. The distance of protrusion of the connector 118 may be adjustable to be coupleably received by a device, such as a personal computer, printer, mobile phone, or the like. For example, such devices may have a USB port with a certain depth to coupleably receive the USB drive 110. The protrusion of the connector 118 may therefore be sized and shaped to be coupleably received by such devices.

Again, the housing 112 also includes a projection 128. The illustrated projection 128 can be located proximal to an intersection of an upper side of the main body 116 and a side extending at an angle from the upper side of the main body 116. The projection 128 is cylindrically shaped and includes a utility aperture 130 extending therethrough. The utility aperture 130 of the projection 128 can be configured such that the USB drive 110 can be coupled to holding devices. For example, the utility aperture 130 can be removably coupled to a key chain ring, identification badge lanyard, or the like.

With continued reference to FIGS. 4 through 6, the cover 114 forms a lower portion of the USB drive 110 when in the closed configuration. The illustrated cover 114 is generally rectangularly shaped. As noted above, the cover 114 can be configured such that, when the cover 114 is coupleably received by the housing 112, the cover 114 substantially abuts or makes contact with a corresponding surface of the housing 112 in a manner to allow the USB drive 110 to appear as a unitary structure Again, the cover 114 can include a cavity 132 extending through an upper surface. As noted above, the cavity 132 is configured such that, when the cover 114 is coupleably received by the housing 112, the connector 118 is coupleably received in the cavity 132 and, further, provides an appearance of a unitary structure of the USB drive 110.

Figure 7:
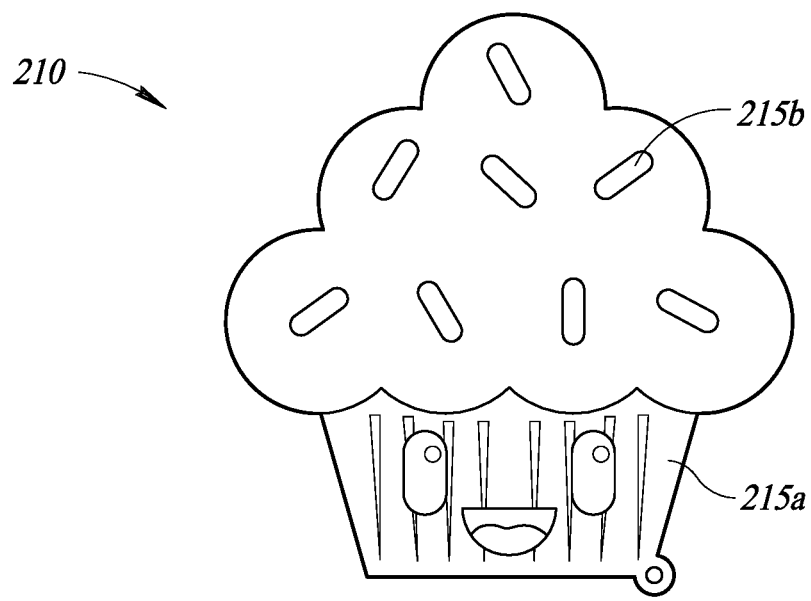
FIG. 7 is a plan view of a scented USB drive in a closed configuration, according to another embodiment.
Figure 8:
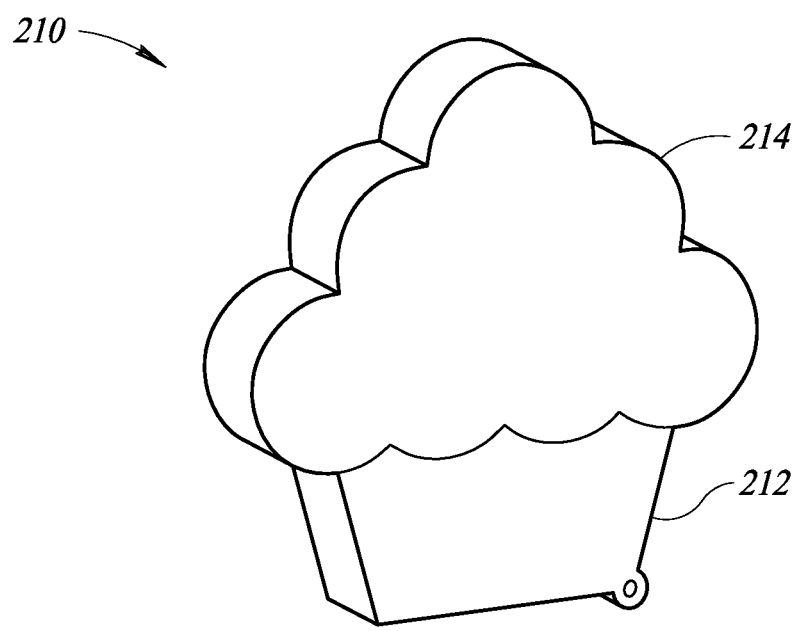
FIG. 8 is a perspective view of the scented USB drive of FIG. 7 in the closed configuration.
Figure 9:
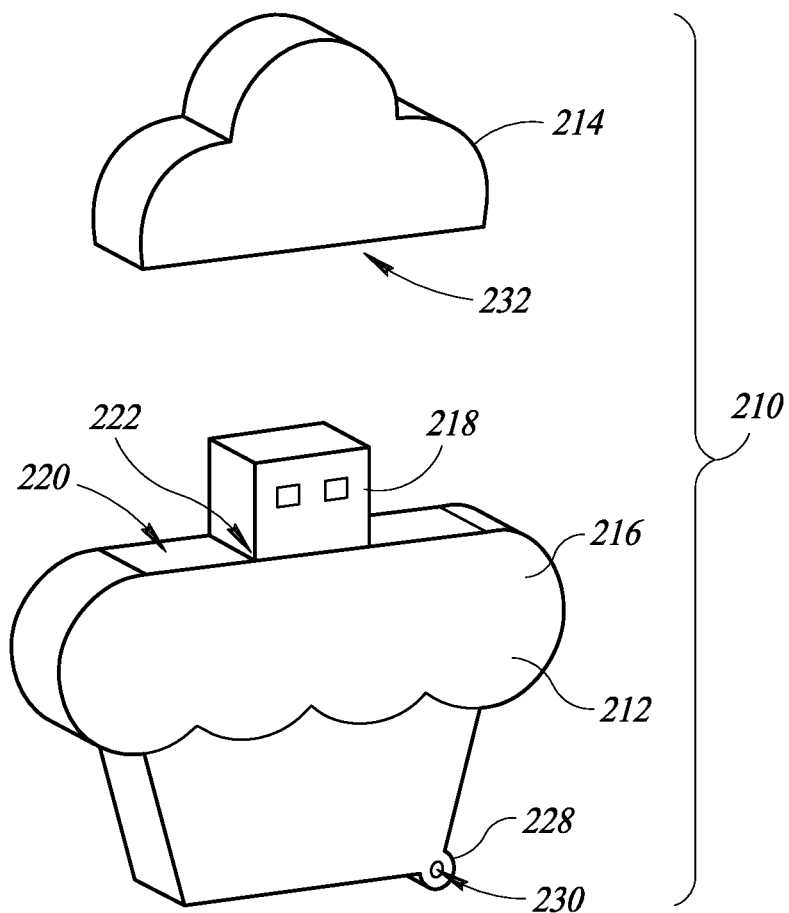
FIG. 9 is a perspective view of the scented USB drive of FIG. 7 in an open configuration.

FIGS. 7 through 9 illustrate a USB drive 210 according to another embodiment. The USB drive 210 provides a variation in which the USB drive 210 includes a housing 212 and a cover 214, where the housing 212 forms a lower portion and the cover 214 forms an upper portion of the USB drive 210 when in a closed configuration. More particularly, the housing 212 and the cover 214 are configured to be removably coupleable to each other to advantageously create a general shape of a cake, such as a cup cake, for example. Again, the housing 212 and the cover 214 can include a representation to depict the cake. For example, the USB drive 210 illustrated in FIGS. 7 through 9 includes labels 215a, 215b which display eyes, mouth, level of sprinkles, various color schemes, etc., to depict the cake, although FIGS. 8 and 9 depict the USB drive 210 with at least some labels removed for clarity of illustration. These labels 215a, 215b can be coupled to the housing 212 and/or the cover 214, respectively. For example, the labels 215a, 215b can be adhesively coupled to the housing 212 and/or the cover 214.

Again, the housing 212 includes a main body 216. The main body 216 encloses therein a circuit board of the USB drive 210. The circuit board is coupled to a connector 218 in a known manner. The connector 218 may be a USB 3.0 A-type, B-Type, Micro or Mini, or other type of connector. The main body 216 provides a protective shield to the circuit board and also to the connector 218 when the cover 214 is coupled to the housing 212 in the closed configuration. As noted above, the connector 218 extends outwardly a certain distance from an upper surface 220 of the main body 216. In particular, the upper surface 220 can include an aperture 222 to allow the connector 218 to protrude outwardly from the main body 216. The distance of protrusion of the connector 218 may be adjustable to be coupleably received by a device, such as a personal computer, printer, mobile phone, or the like. For example, such devices may have a USB port with a certain depth to coupleably receive the USB drive 210. The protrusion of the connector 218 may therefore be sized and shaped be coupleably received in such devices.

Again, the illustrated housing 212 also includes a projection 228. The projection 228 can be located proximal to an intersection of a lower side of the main body 216 and a side extending at an angle from the lower side of the main body 216. The illustrated projection 228 is cylindrically shaped and includes a utility aperture 230 extending therethrough. The utility aperture 230 of the projection 228 is configured such that the USB drive 210 can be coupled to holding devices. For example, the utility aperture 230 can be removably coupled to a key chain ring, identification badge lanyard, or the like.

With continued reference to FIGS. 7 through 9, the cover 214 forms an upper portion of the USB drive 210 when in the closed configuration. The illustrated cover 214 is generally curvilinearly shaped to represent icing or frosting of a cup cake. As noted above, the cover 214 can be configured such that, when the cover 214 is coupleably received by the housing 212, the cover 214 substantially abuts or makes contact with a corresponding surface of the housing 212 in a manner to allow the USB drive 210 to appear as a unitary structure.

Again, the cover 214 can include a cavity 232 extending through a lower surface. As noted above, the cavity 232 is configured such that, when the cover 214 is coupleably received by the housing 212, the connector 218 is coupleably received in the cavity 232 and, further, provides an appearance of a unitary structure of the USB drive 210.

Figure 10:
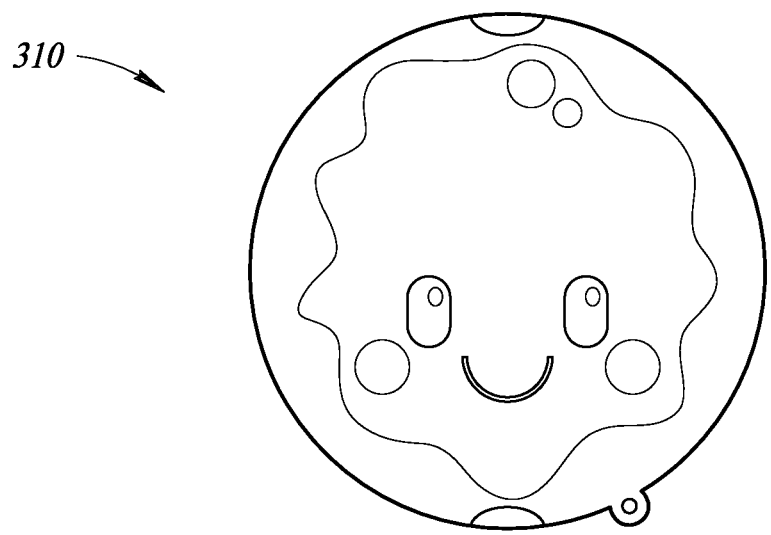
FIG. 10 is a plan view of a scented USB drive in a closed configuration, according to another embodiment.
Figure 11:
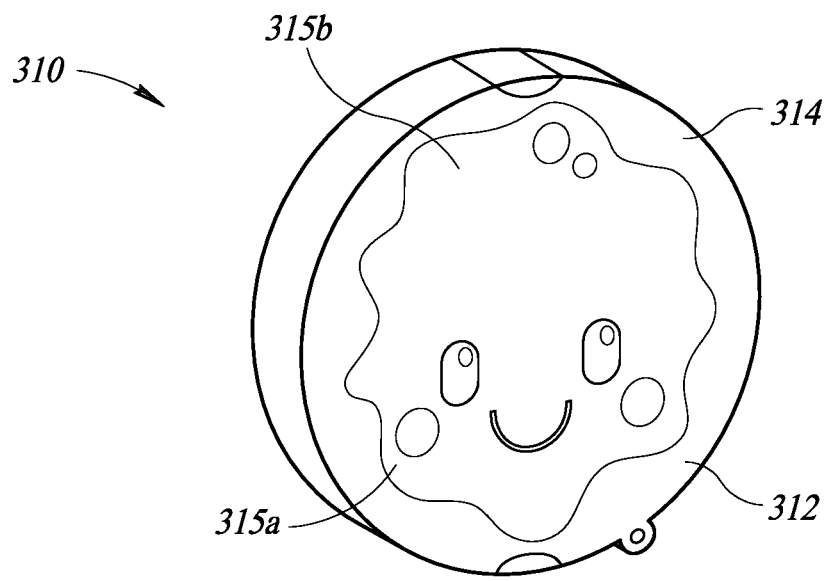
FIG. 11 is a perspective view of the scented USB drive of FIG. 10 in the closed configuration.
Figure 12:
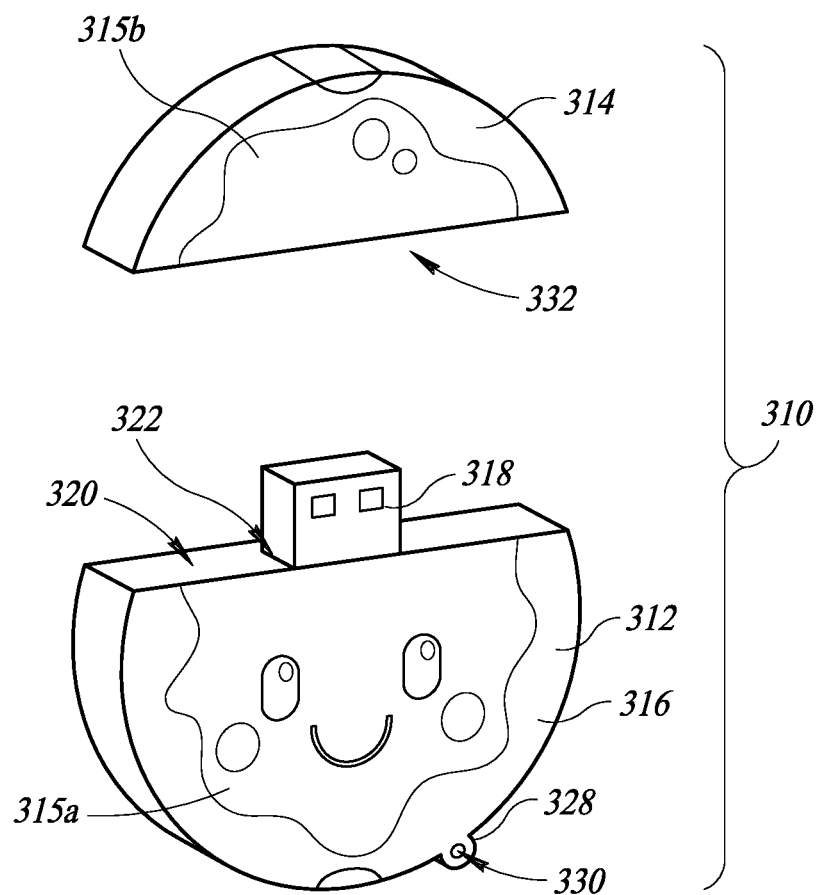
FIG. 12 is a perspective view of the scented USB drive of FIG. 10 in an open configuration.

FIGS. 10 through 12 illustrate a USB drive 310 according to another embodiment. The USB drive 310 provides a variation in which the USB drive 310 includes a housing 312 and a cover 314, where the housing 312 forms a lower portion and the cover 314 forms an upper portion of the USB drive 310 when in a closed configuration. More particularly, the housing 312 and the cover 314 are configured to be removably coupleable to each other to advantageously create a general shape of a donut, such as a jelly donut, for example. Again, the housing 312 and the cover 314 can include a representation to depict the donut. For example, the USB drive 310 illustrated in FIGS. 10 through 12 includes labels 315a, 315b which display eyes, mouth, jelly, various color schemes, etc., to depict the donut. These labels 315a, 315b can be coupled to the housing 312 and/or the cover 314, respectively. For example, the labels 315a, 315b can be adhesively coupled to the housing 312 and/or the cover 314.

Again, the housing 312 includes a main body 316. The main body 316 encloses therein a circuit board of the USB drive 310. The circuit board is coupled to a connector 318 in a known manner. The connector 318 may be a USB 3.0 A-type, B-Type, Micro or Mini, or other type of connector. The main body 316 provides a protective shield to the circuit board and also to the connector 318 when the cover 314 is coupled to the housing 312 in the closed configuration. As noted above, the connector 318 extends outwardly a certain distance from an upper surface 320 of the main body 316. In particular, the upper surface 320 can include an aperture 322 to allow the connector 318 to protrude outwardly from the main body 316. The distance of protrusion of the connector 318 may be adjustable to be coupleably received by a device, such as a personal computer, printer, mobile phone, or the like. For example, such devices may have a USB port with a certain depth to coupleably receive the USB drive. The protrusion of the connector 318 may therefore be sized and shaped to be coupleably received in such devices.

Again, the illustrated housing 312 also includes a projection 328. The projection 328 is located along a circumferential surface of the main body 316. The illustrated projection 328 is cylindrically shaped and includes a utility aperture 330 extending therethrough. The utility aperture 330 of the projection 328 is configured such that the USB drive 310 can be coupled to holding devices. For example, the utility aperture 330 can be removably coupled to a key chain ring, identification badge lanyard, or the like.

With continued reference to FIGS. 10 through 12, the cover 314 forms an upper portion of the USB drive 310 when in the closed configuration. The illustrated cover 314 is generally semi-circularly shaped to represent an upper portion of a donut. As noted above, the cover 314 can be configured such that, when the cover 314 is coupleably received by the housing 312, the cover 314 substantially abuts or makes contact with a corresponding surface of the housing 312 in a manner to allow the USB drive 310 to appear as a unitary structure.

Again, the cover 314 can include a cavity 332 extending through a lower surface. As noted above, the cavity 332 can be configured such that, when the cover 314 is coupleably received by the housing 312, the connector 318 is coupleably received in the cavity 332 and, further, provides an appearance of a unitary structure of the USB drive 310.

Figure 13:
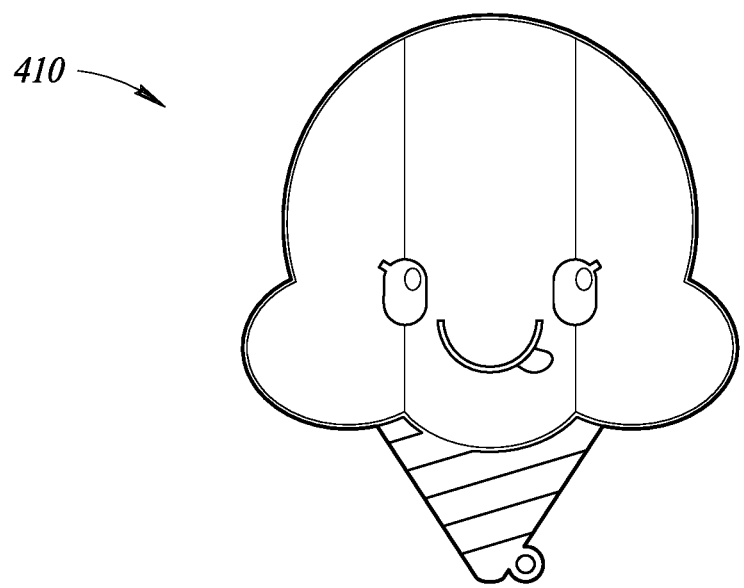
FIG. 13 is a plan view of a scented USB drive in a closed configuration, according to yet another embodiment.
Figure 14:
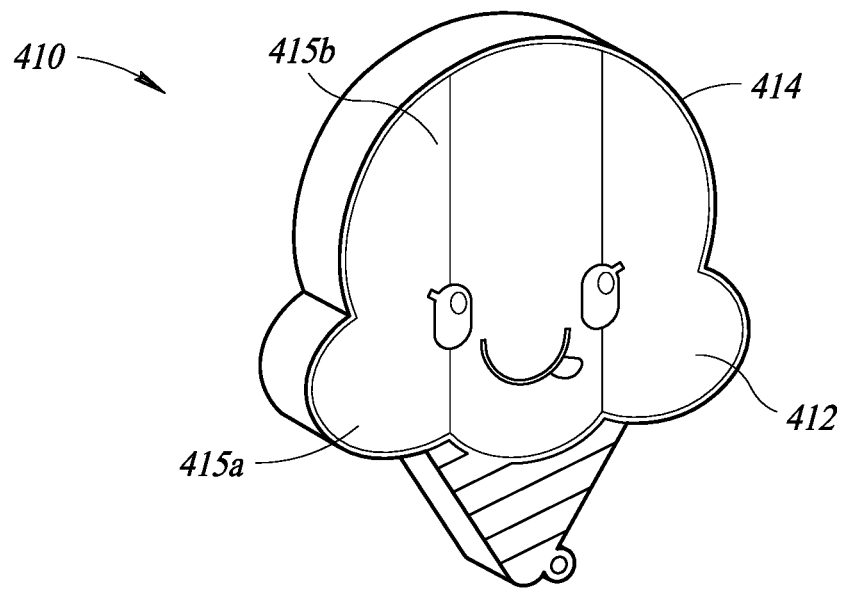
FIG. 14 is a perspective view of the scented USB drive of FIG. 13 in the closed configuration.
Figure 15:
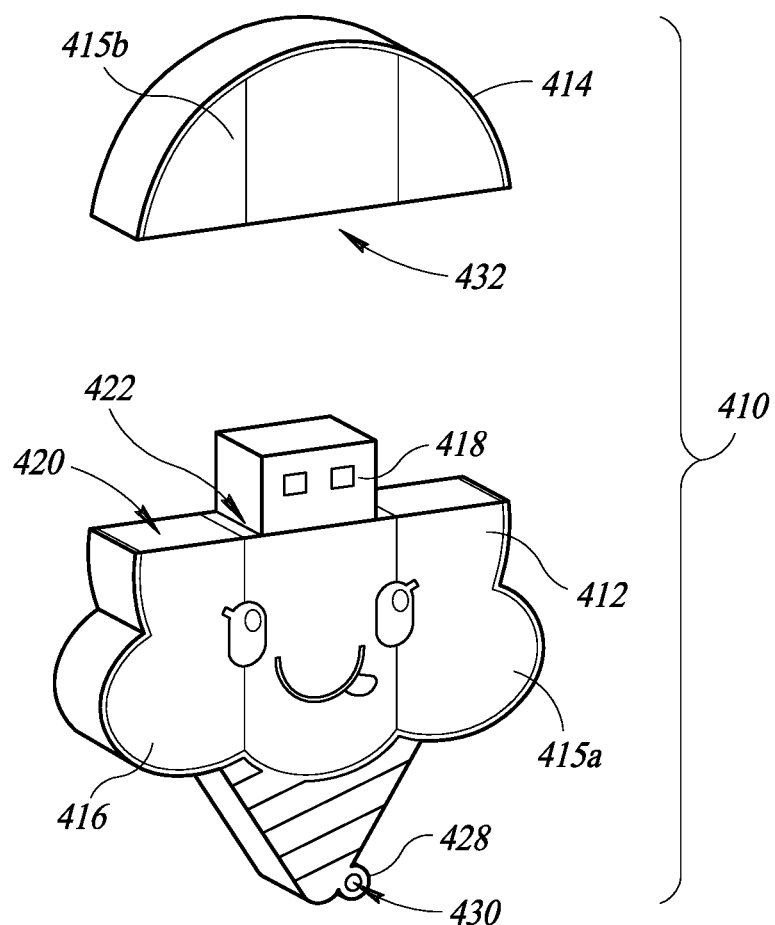
FIG. 15 is a perspective view of the scented USB drive of FIG. 13 in an open configuration.

FIGS. 13 through 15 illustrate a USB drive 410 according to yet another embodiment. The USB drive 410 provides a variation in which the USB drive 410 includes a housing 412 and a cover 414, where the housing 412 forms a lower portion and the cover 414 forms an upper portion of the USB drive 410 when in a closed configuration. More particularly, the housing 412 and the cover 414 are configured to be removably coupleable to each other to advantageously create a general shape of an ice cream cone, such as a rainbow sherbet ice cream cone, for example. Again, the housing 412 and the cover 414 can include a representation to depict the rainbow sherbet ice cream cone. For example, the USB drive 410 illustrated in FIGS. 13 through 15 includes labels 415a, 415b which display eyes, mouth, cone, various color schemes, etc., to represent the ice cream cone. These labels 415a, 415b can be coupled to the housing 412 and/or the cover 414, respectively. For example, the labels 415a, 415b can be adhesively coupled to the housing 412 and/or the cover 414.

Again, the housing 412 includes a main body 416. The main body 416 encloses therein a circuit board of the USB drive 410. The circuit board is coupled to a connector 418 in a known manner. The connector 418 may be a USB 3.0 A-type, B-Type, Micro or Mini, or other type of connector. The main body 416 provides a protective shield to the circuit board and also to the connector 418 when the cover 414 is coupled to the housing 412 in the closed configuration. As noted above, the connector 418 extends outwardly a certain distance from an upper surface 420 of the main body 416. In particular, the upper surface 420 can include an aperture 422 to allow the connector 418 to protrude outwardly from the main body 416. The distance of protrusion of the connector 418 may be adjustable to be coupleably received by a device, such as a personal computer, printer, mobile phone, or the like. For example, such devices may have a USB port with a certain depth to coupleably receive the USB drive. The protrusion of the connector 418 may therefore be sized and shaped to be coupleably received in such devices.

Again, the illustrated housing 412 also includes a projection 428. The projection 428 is located proximal to an apex of sides of the main body 416. These sides of the main body 416 are triangularly shaped and located at a lower portion of the main body 416, depicting the ice cream cone. The illustrated projection 428 is cylindrically shaped and includes a utility aperture 430 extending therethrough. The utility aperture 430 of the projection 428 is configured such that the USB drive 410 can be coupled to holding devices. For example, the utility aperture 430 can be removably coupled to a key chain ring, identification badge lanyard, or the like.

With continued reference to FIGS. 13 through 15, the cover 414 forms an upper portion of the USB drive 410 when in the closed configuration. The illustrated cover 414 is generally semi-circularly shaped to represent an upper portion of the ice cream. As noted above, the cover 414 can be configured such that, when the cover 414 is coupleably received by the housing 412, the cover 414 substantially abuts or makes contact with a corresponding surface of the housing 412 in a manner to allow the USB drive 410 to appear as a unitary structure.

Again, the cover 414 can include a cavity 432 extending through a lower surface. As noted above, the cavity 432 is configured such that, when the cover 414 is coupleably received by the housing 412, the connector 418 is coupleably received in the cavity 432 and, further, provides an appearance of a unitary structure of the USB drive 410.

A method to manufacture the embodiments of the USB drives (e.g., 10, 110, 210, 310, 410) is also provided. According to one embodiment, the method includes providing compositions of fragrances. In some embodiments, the fragrances may be liquid-based fragrance. In other embodiments, the fragrances may be powder-based. The fragrance may take a wide variety of forms, such as aqueous, alcoholic, oil based solutions, or any petroleum based compound. In particular, the fragrances are configured to have a selective aroma, such as strawberry, coffee, orange cream, etc. The fragrance is thereafter poured into a holder device containing a composition comprising a molding composition, such as silicone. The silicone may be in liquid phase or form, such as curable liquid silicone rubber, for example. The liquid silicone may be provided in two parts, such as Part A and Part B, for example, and may include catalysts to improve cure times. The Parts A and B may be mixed together into final liquid silicone form.

In some embodiments, prior to pouring the fragrance, the liquid silicone may be heated to temperatures between 200° F. to 400° F., or any other suitable temperatures, in a heat chamber, for example. In other embodiments, the fragrance and the liquid silicone may be heated together to suitable temperatures, after pouring the fragrance into the liquid silicone composition. The fragrance, once poured into the holding device containing liquid silicone, may be mixed and stirred for a certain duration. For example, in some embodiments, the fragrance and the liquid silicone may be mixed for a duration of 30 minutes, one hour, two hours, or any other suitable duration.

The fragrance may be provided in optimal percentages by weight or volume. For example, in some embodiments, the fragrance may comprise between about 5 to 20% by weight or volume of the total solution or the molding compound. In other embodiments, the fragrance may comprise about 15% by weight or volume of the total solution or the molding compound, with the remaining composition comprising mostly liquid silicone and other suitable additives. In particular, applicant has discovered, via experimentation and substantial field testing, that providing fragrances in such percentages optimizes the released aroma or scent of the fragrance. For example, by providing fragrance in about 15% by weight or volume, the aroma or scent released may have optimal strength and may be released for a duration of up to about six months. In some embodiments, the percentage of fragrance may be selectively adjusted to selectively increase or decrease the duration the aroma or scent may be released from the various embodiments of the scented USB drives.

The total solution or molding compound formed after mixing the fragrance and the liquid silicone may thereafter be injected or cast into a mold. In some embodiments, the total solution or molding compound may be cooled prior to injection. In other embodiments, the total solution or molding compound may remain at higher temperatures due to the heating of the total solution or molding compound, as described above, during injection. The mold may be configured such that a final exterior form of an article formed by the molding process may represent the various embodiments of the USB drives (e.g., 10, 110, 210, 310, 410) described herein. In some embodiments, the mold may include a recess. The recess can be configured to receive a circuit board of the USB drives. The total solution or molding compound may be injected into cavities of the mold via injectors or injection devices having suitable pressure and injection rates. Further, in some embodiments, the mold may also be subjected to heating to various temperatures, for example, temperatures ranging between 200° F. to 400° F., or any other suitable temperature.

Thereafter, solidification or curing process may be initiated to solidify the total solution or molding compound into solid form. For example, in some embodiments, the mold may be cooled at ambient temperature for duration of between 30 minutes to about twenty four hours. In other embodiments, the mold may be cooled for between about 24 hours to about 48 hours at ambient temperature. In some embodiments, the solidification or curing process may include injecting a cooling liquid over the mold. The cooling liquid may be set to suitable temperatures to expedite the solidification step. Still further, in some embodiments, certain catalysts may be added to expedite the curing process.

After the composition has solidified, the article in its final exterior form may be removed from the mold. The circuit board of the USB drive may then be inserted into the recess. The circuit board can be coupled to the final exterior form of the USB drive via adhesives. Thereafter, as noted above, selective labels may be affixed to the article. The labels may be adhesively affixed to the article.

In some embodiments, the fragrance may be poured into a holder device containing a composition comprising a molding composition, such as polyvinyl chloride ("PVC") (e.g., plastisol), for example, in lieu of silicone. The PVC may be in liquid phase or form. The PVC may be heated prior to pouring the fragrance or together with the fragrance. The fragrance, once poured into the holding device containing liquid PVC, may be mixed and stirred for a suitable duration, as discussed above.

Again, the fragrance may be provided in optimal percentages by weight or volume. For example, in some embodiments, the fragrance may comprise between about 5 to 20% by weight or volume of the total solution or the molding compound. In other embodiments, the fragrance may comprise about 15% by weight or volume of the total solution or the molding compound, with the remaining composition comprising mostly liquid PVC and other suitable additives. In particular, applicant has discovered, via experimentation and substantial field testing, that providing fragrances in such percentages optimizes the released aroma or scent of the fragrance. Further, as discussed above, in some embodiments, the percentage of fragrance may be selectively adjusted.

Again, the total solution or molding compound formed after mixing the fragrance and the liquid PVC may thereafter be injected or cast into a mold. In some embodiments, the total solution or molding compound may be cooled prior to injection. In other embodiments, the total solution or molding compound may remain at higher temperatures due to the heating of the total solution or molding compound, as described above, during injection. The mold may be configured such that a final exterior form of an article formed by the molding process may represent the various embodiments of the USB drives (e.g., 10, 110, 210, 310, 410) described herein. In some embodiments, the mold may include a recess. The recess can be configured to receive a circuit board of the USB drives. The total solution or molding compound may be injected into cavities of the mold via injectors or injection devices having suitable pressure and injection rates. Further, in some embodiments, the mold may also be subjected to heating to various temperatures, for example, temperatures ranging between 200° F. to 400° F., or any other suitable temperature.

Thereafter, as discussed above, solidification or curing process may be initiated to solidify the total solution or molding compound into solid form, such as by cooling, for example. After the composition has solidified, the article in its final exterior form may be removed from the mold. As discussed above, the circuit board of the USB drives may then be inserted into the recess and coupled via adhesives. Selective labels may then be adhesively affixed to the articles.

Moreover, the various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a scented USB drive, the method comprising: providing a fragrance; providing a molding composition; mixing the fragrance with the molding composition, the mixing forming a molding compound; injecting the molding compound into a mold and around a recess configured to receive a circuit board; and cooling the molding compound until a solid USB drive is formed, the solid scented USB drive emitting a selective scent.

2. The method of claim 1 wherein the molding composition is heated prior to mixing with the fragrance.

3. The method of claim 1 wherein the fragrance is oil based.

4. The method of claim 1 wherein the molding compound includes by weight about 5 to 20% fragrance.

5. The method of claim 1 wherein the molding compound includes by weight about 15% fragrance.

6. The method of claim 1 wherein the solid scented USB drive releases the selective scent for at least six months.

7. The method of claim 1 wherein the molding compound is cooled at ambient temperature.

8. The method of claim 1, further comprising: affixing a label to the solid scented USB drive, the label configured to depict an appearance of at least one of a bottle, an ice cream bar, an ice cream cone, or a cupcake.

9. The method of claim 1 wherein the mold is configured to form the solid scented USB drive in a shape comprising at least one of a bottle, an ice cream bar, an ice cream cone, and a cupcake.

10. The method of claim 1 wherein the molding composition comprises at least one of liquid silicone and liquid PVC.

11. The method of claim 1 wherein the fragrance is powder-based.

12. A USB drive, comprising: a housing enclosing a circuit board of the USB drive; and a cover configured to be removably coupled to the housing, wherein the cover and the housing comprise a molding compound including a fragrance and a molding composition, the molding compound configured to emit a selective scent.

13. The USB drive of claim 12 wherein the molding compound comprises by weight about 5 to 20% fragrance.

14. The USB drive of claim 12 wherein the molding compound comprises by weight about 15% fragrance.

15. The USB drive of claim 12, further comprising: a label affixed to the housing and/or the cover, the label configured to depict an appearance of at least one of a bottle, an ice cream bar, an ice cream cone, and a cupcake.

16. The USB drive of claim 12 wherein the housing is coupleable to the cover to create an appearance of at least one of a bottle, an ice cream bar, an ice cream cone, and a cupcake.

17. The USB drive of claim 12 wherein the fragrance is oil-based.

18. The USB drive of claim 12, further comprising: a projection, the projection configured to be coupleable to a holding device.

19. The USB drive of claim 18 wherein the projection includes a utility aperture, the utility aperture configured to be coupleable to the holding device.

* * * * *